United States Patent
Bui et al.

[11] Patent Number: 6,122,212
[45] Date of Patent: Sep. 19, 2000

[54] SENSE AMPLIFIER WITH FEEDBOX MECHANISM

[75] Inventors: John Henry Bui; Chien-fan Wang, both of San Jose, Calif.

[73] Assignee: Winbond Electronics Corporation, San Jose, Calif.

[21] Appl. No.: 09/071,669

[22] Filed: May 1, 1998

[51] Int. Cl.$^7$ .................................. G11C 7/02
[52] U.S. Cl. ............... 365/207; 365/189.07; 365/189.09; 365/185.21; 327/53
[58] Field of Search ........................ 365/207, 208, 365/185.21, 189.07, 189.09, 210, 189.01, 185.01; 327/51, 53

[56] References Cited

U.S. PATENT DOCUMENTS

| | | | |
|---|---|---|---|
| 5,206,552 | 4/1993 | Iwashita | 327/53 |
| 5,386,158 | 1/1995 | Wang | 327/51 |
| 5,508,643 | 4/1996 | Khieu | 327/51 |
| 5,559,737 | 9/1996 | Tanaka et al. | 365/185.25 |
| 5,805,500 | 9/1998 | Campardo et al. | 365/185.2 |
| 5,910,914 | 6/1999 | Wang | 365/185.21 |

*Primary Examiner*—David Nelms
*Assistant Examiner*—Hoai V. Ho
*Attorney, Agent, or Firm*—Dinh & Associates

[57] ABSTRACT

A sense amplifier for detecting a logic state of a memory cell includes a voltage amplifier, a current mirror, and a feedback circuit. The voltage amplifier couples to the memory cell and the current mirror. The feedback circuit couples to the current mirror and an input of the sense amplifier. The feedback circuit can be implemented with a transistor, a switch, a transmission gate, or the like. The feedback circuit is selectively enabled to quickly charge or discharge the voltage at the input of the sense amplifier to a trip voltage of the sense amplifier. Whether charging or discharging is performed is dependent on the voltage then existing at the input node. The amount of charging and discharging current can also be based on other circuit considerations, such as the required charge time, and so on. When the voltage at the input reaches a predetermined voltage range, the feedback circuit is disabled.

33 Claims, 7 Drawing Sheets

SENSE AMPLIFIER WITH FEEDBOX MECHANISM

BACKGROUND OF THE INVENTION

This invention relates generally to an electronic circuit. More particularly, it related to a sense amplifier and related circuitry.

Electronic circuits are used for various applications, including digital logic. Digital logic circuits are used in memory devices, microprocessors, controllers, digital signal processors, application specific integrated circuits, and others. Digital logic circuits can be classified into three popular logic families: (1) transistor-transistor logic (TTL), (2) emitter-coupled logic (ECL), and complementary metal-oxide-semiconductor (CMOS). CMOS logic circuits offer advantages over other logic families because of its low dissipation power, compact design, and noise immunity.

In the area of memory devices, a variety of volatile and non-volatile memory devices have been used or proposed by the electronic industry. Example of such memory devices include random access memory (RAM), read only memory (ROM), programmable read-only memory (PROM), erasable PROM (EPROM), and flash memory devices. These memory devices can be implemented in a dedicated memory integrated circuit or incorporated within a processor, such as an embedded processor.

Memory devices typically include a memory array having M rows by N columns of memory cells, a row decoder, a column decoder, sense amplifiers, and output buffers. The row and column decoders accept input address lines and generate control signals, corresponding to the address lines, that are used to select the desired memory cells from which to read and to which to write. During a read operation, the selected memory cells are coupled to the associated sense amplifiers that detect the state (i.e., logic high or logic low) of the memory cells. The signals from the sense amplifiers are receive by the output buffers, latched, and provided as the output logic signals.

Typically, the state of a memory cell is determine by a "voltage" or a charge on a floating gate of a transistor that makes up the memory cell. The voltage determines the conduction state of the memory cell. For an N-channel enhancement mode transistor memory cell, a high voltage on the floating gate causes the transistor to conduct current when selected. Alternatively, a low voltage at the floating gate causes the transistor not to conduct when selected. Typically, the transistor is sized such that only a small amount of current passes through a conducting transistor.

A sense amplifier is coupled, usually through a multiplexer, to the selected memory cell and determines whether the selected memory cell has been "programmed" to conduct or not to conduct. An example of a sense amplifier design is disclosed in U.S. Pat. No. 5,386,158 entitled "SENSING CIRCUIT FOR A FLOATING GATE MEMORY DEVICE", issued Jan. 31, 1995. The sense amplifier of the '158 patent compares a voltage of the selected memory cell against a voltage on a "dummy" memory cell that is connected in a conducting state. The sense amplifier includes two voltage amplifiers and two current mirrors one voltage amplifier and current mirror for each of the two memory cells. The voltage amplifier for the selected memory cell includes a "control" transistor having its drain connected to its gate. This "control" transistor provides additional gain for the voltage amplifier. The sense amplifier provides an output signal indicative of the logic state of the selected memory cell.

The performance of many sense amplifiers is susceptible to temperature and power supply variations. For example, the sense amplifier of the '158 patent includes a diode 34 in the voltage amplifier 20. At high temperature and low power supply voltage, the diode slows down its charging of a pull up transistor 38, thereby noticeably slowing down the sense amplifier.

The ability to correctly "read" the values stored in the memory cells is dependent, in part, on the performance of the sense amplifiers. Therefore, sense amplifiers having improved performance and less susceptible to component tolerance, temperature, and power supply variations are clearly desired

SUMMARY OF THE INVENTION

The present invention provides a sense amplifier for detecting a logic state of a memory cell and having improved performance. The sense amplifier includes a voltage amplifier, a current mirror, and a feedback circuit. The voltage amplifier couples to the memory cell and the current mirror. The feedback circuit couples to the current mirror and an input of the sense amplifier. In one embodiment, the various circuits within the sense amplifier are implemented using MOS transistors. The feedback circuit can be implemented with a transistor, a switch, a transmission gate, or the like.

In a conventional CMOS memory cell, a transistor within the cell is programmed to conduct or not to conduct, depending on the logic state of the cell, when selected. The feedback circuit is selectively enabled to quickly charge or discharge the voltage at the input of the sense amplifier (input node) to a trip voltage of the sense amplifier. Whether charging or discharging is performed is dependent on the voltage then existing at the input node. The amount of charging and discharging current can also be based on other circuit considerations, such as the required charge time, and so on. When the voltage at the input reaches a predetermined voltage range, the feedback circuit is disabled. Thus, the feedback circuit is selectively enabled for the required time periods.

Additional sense circuitry can be built into the sense amplifier to detect when the voltage at the input node is within the predetermined voltage range. The sense circuitry can be designed using additional current mirrors so that the effect of power supply voltage and temperature variations is tracked and minimized.

A control circuit couples to the sense amplifier. The control circuit receives signals from the sense circuitry and generates a control signal that is used to control the feedback circuit.

A logic circuit can be designed to receive the control signals from all sense amplifiers and to generate a read signal in response to the control signals.

For a further understanding of the nature and advantages of the invention, reference should be made to the ensuing detailed description taken in conjunction with the accompanying drawings.

DETAILED DESCRIPTION OF THE INVENTION

Figure 1:
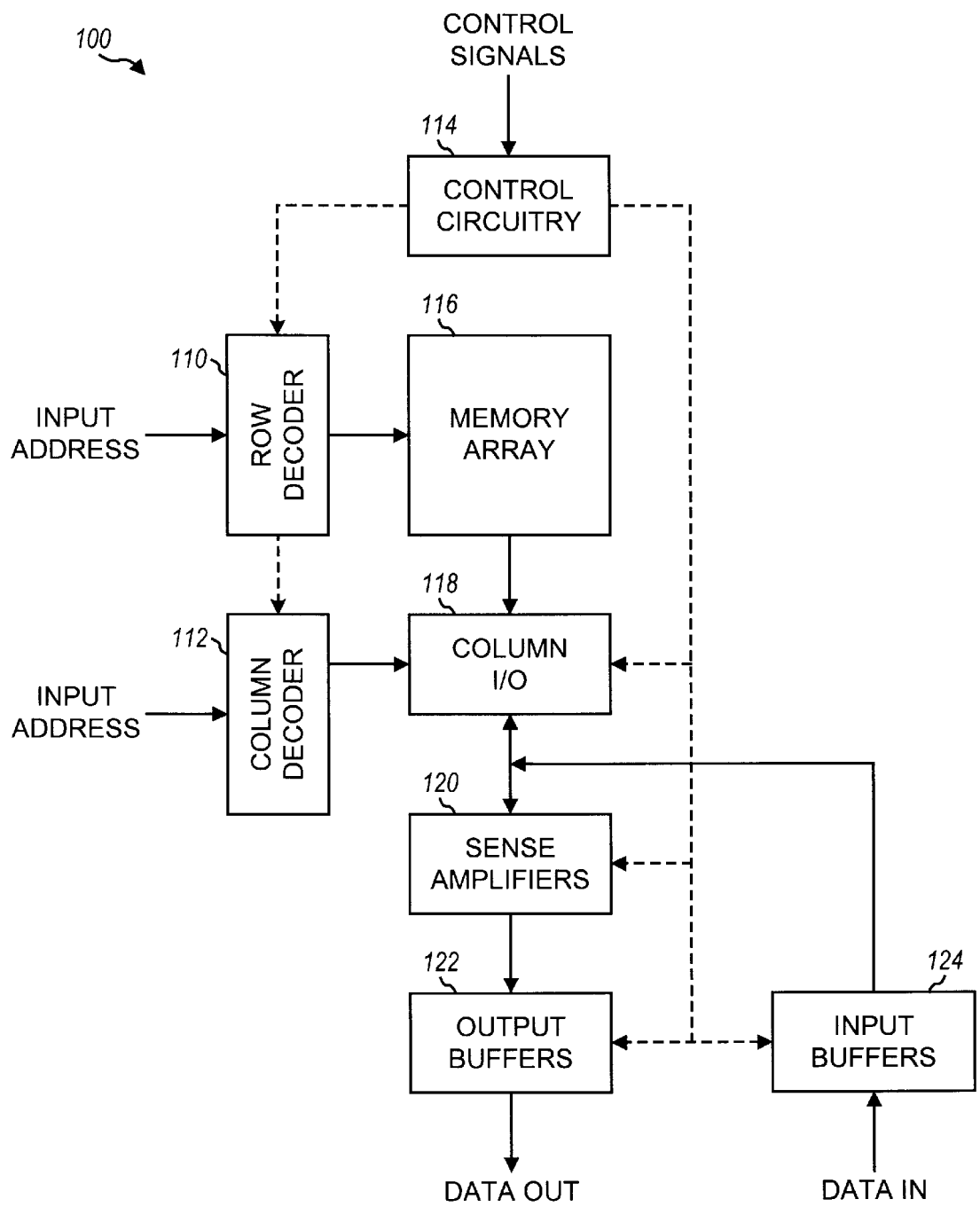
FIG. 1 is a simplified block diagram of a typical memory device.

Referring to FIG. 1, a simplified block diagram of a typical memory device 100 is shown. Memory device 100 includes (1) a row address decoder 110 for receiving input address lines and generating "enable" signals, (2) a column address decoder 112 for receiving additional input address lines and generating additional "enable" signals, (3) a control circuit 114 for receiving control signals and generating the necessary timing signals, (4) a memory array 116 having a collection of memory cells, (5) a column I/O 118 for multiplexing selected memory cells to the output, (6) sense amplifiers 120 for receiving and sensing logic state of the selected memory cells, (7) output buffers 122 for buffering and providing data output. and (8) input buffers 124 for receiving and buffering the data input. Memory array 116 couples to row decoder 112 and column I/O 118. Column I/O 118 also couples to sense amplifiers 120 and input buffers 124. Sense amplifiers 122 also couples to output buffers 122. Control circuitry 114 couples to row decoder 110, column decoder 112, column I/O 118, sense amplifiers 120, input buffers 122, and output buffers 124.

Figure 2:
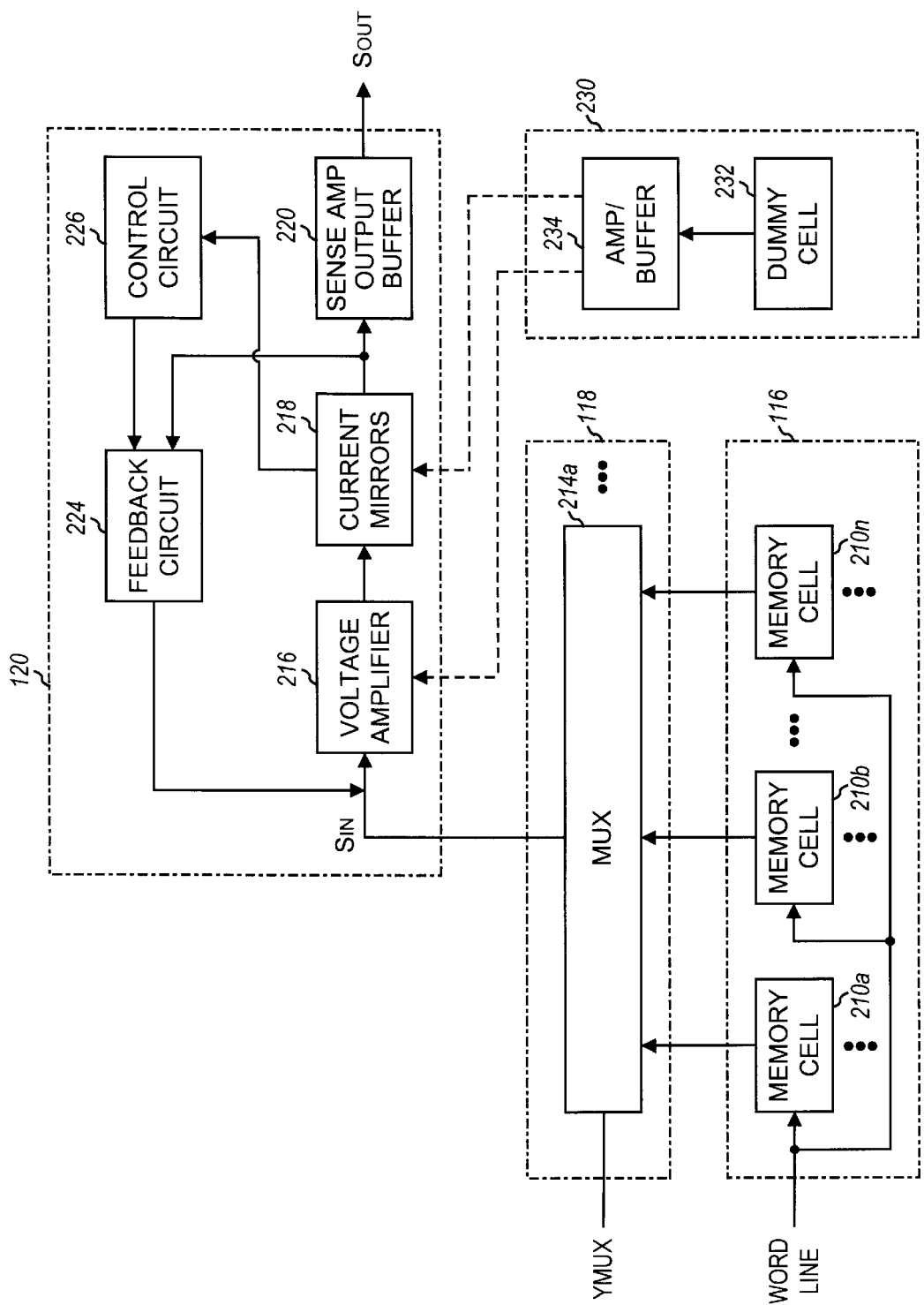
FIG. 2 is a simplified block diagram of a memory array and a sensing circuitry of the memory device.

FIG. 2 is a simplified block diagram of memory array 116 and the sensing circuitry of memory device 100. Memory array 116 includes a collection of memory cells 210 that are typically arranged by row and column. A word line signal from row decoder 110 selects a row of memory cells 210a through 210n within memory array 116. Each row of memory cells couples to an associated multiplexer (MUX) 214 within column I/O 118. MUX 214 provides a selected memory cell 210 to a sense amplifier 120.

Within sense amplifier 120, the selected memory cell 210 is coupled to a voltage amplifier 216 that couples to rent mirrors 218. Current mirrors 218 couple to a sense amp output buffer 222 and to a feedback circuit 224. Feedback circuit 224 couples to the input $S_{IN}$ of sense amplifier 120. The output of sense amp output buffer 222 forms the output $S_{OUT}$ of sense amplifier 120. A control circuit 226 couples to current mirrors 218 and feedback circuit 224.

In one embodiment, a reference circuit 230 is included to provide improved performance in logic detection. Reference circuit 230 includes a dummy memory cell 232 designed similar to memory cell 210 and configured in a known state, e.g., conducting state. Memory cell 232 couples to an amplifier/buffer 234 that provides a reference signal (either voltage or current). The reference signal couples to voltage amplifier 216, current mirrors 218, and sense amp output buffer 222, or any combination thereof. Reference circuit 230 is an optional element.

Furthermore, reference circuit 230 can be designed in numerous manners by those skilled in the art.

Figure 3:
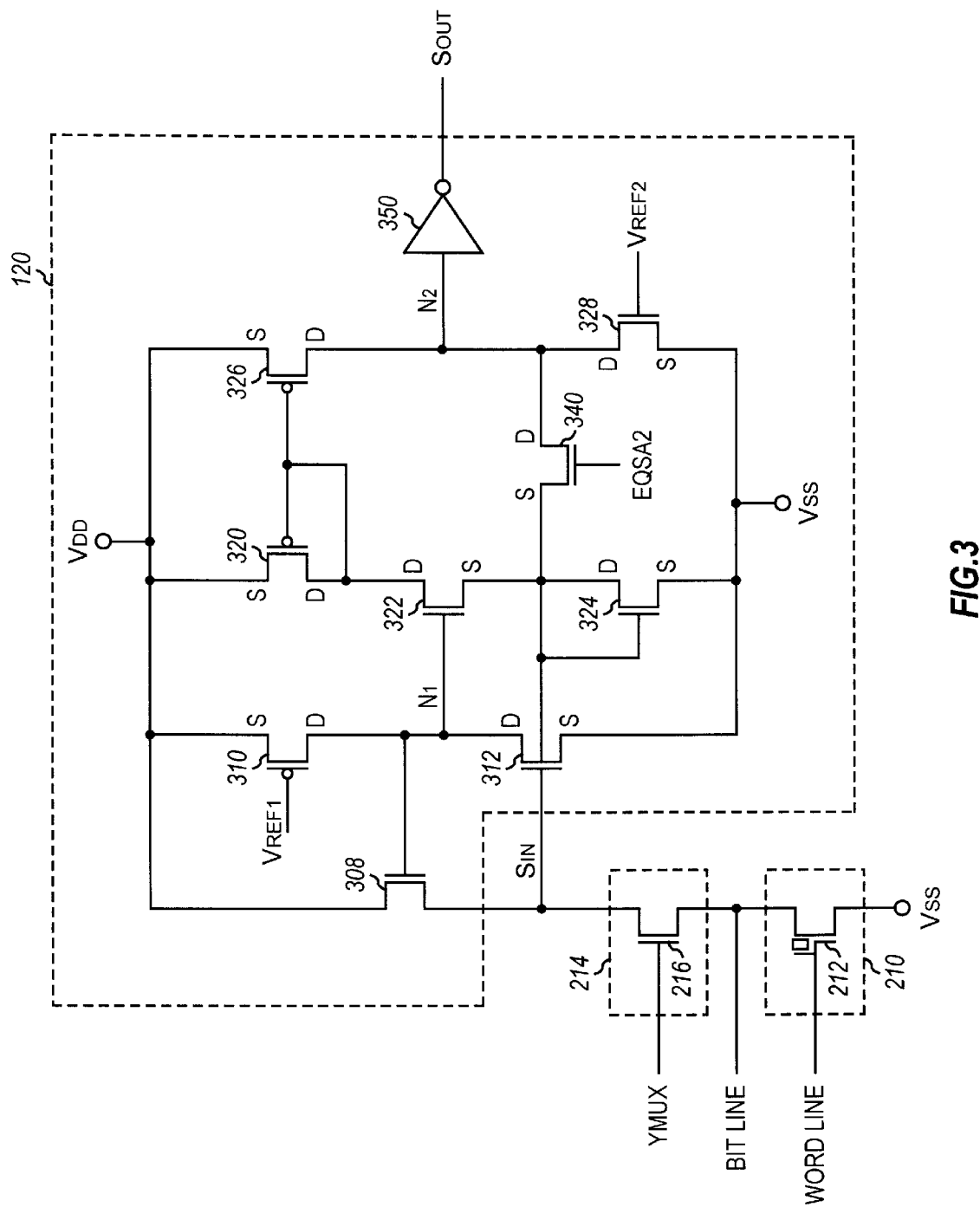
FIG. 3 illustrates a simplified schematic of one embodiment of a memory cell, a portion of a MUX, and a sense amplifier.

FIG. 3 illustrates a simplified schematic of one embodiment of the selected memory cell 210, a portion of MUX 214, and sense amplifier 120. Memory cell 210 includes a transistor 212 having a floating gate. The floating gate is charged (or discharged) to place transistor 212 into a conducting (or non-conducting) state. A charged floating gate can represent a logic high and a discharged floating gate can represent a logic low. MUX 214 includes a collection of transistors 216 (only one is shown in FIG. 3 for simplicity) configured to couple the selected memory cell 210 to the input $S_{IN}$ of sense amplifier 120.

FIG. 3 illustrates one embodiment of sense amplifier 120. Other variations of sense amplifier 120 can be designed by those skilled in the art. Sense amplifier 120 includes a voltage amplifier (i.e., voltage amplifier 216 in FIG. 2) formed by a P-channel transistor 310 coupled in series with an N-channel transistor 312. Transistor 310 includes a source that couples to a positive power Supply $V_{DD}$, a gate that couples to a reference voltage $V_{REF1}$, and a drain that couples to a drain of transistor 312. Transistor 312 also includes a source that couples to a negative power supply $V_{SS}$ and a gate that forms the input $S_{IN}$ of sense amplifier 120. An N-channel 308 includes a gate that couples to node N1, a source that couples to the input $S_{IN}$, and a drain that couples to the positive power supply $V_{DD}$.

Sense amplifier 120 further includes a current mirror (i.e., current mirrors 218 in FIG. 2) formed by an N-channel transistor 322 and P-channel transistors 320 and 326. Transistors 320 and 322 and an N-channel transistor 324 are coupled in series. Transistor 320 includes a source that couples to the positive power supply $V_{DD}$ and a drain that couples to a drain of transistor 322 and the gates of transistors 320 and 326. Transistor 322 also includes a gate that couples to the drain of transistor 312 and a source that couples to the gate of transistor 312 and to a gate and a drain of transistor 324. A source of transistor 324 couples to the negative power supply $V_{SS}$. A P-channel transistors 326 couples in series with an N-channel transistor 328. Transistor 326 includes a source that couples to the positive power supply $V_{DD}$ and a drain that couples to a drain of transistor 328.

Transistor 328 also includes a gate that couples to a reference voltage $V_{REF2}$ and a source that couples to the negative power supply $V_{SS}$.

An N-channel transistor 340 includes a drain that couples to the drain of transistor 328, a source that couples to the input $S_{IN}$, and a gate that couples to an EQSA2 control signal.

Transistors 310 and 312 behave as a voltage amplifier. Transistor 312 is an inverting amplifier having a load provided by transistor 310. Transistor 310 is biased with the reference voltage $V_{REF1}$ to provide a predetermined amount of current. Transistor 308 helps to precharge the voltage at $S_{IN}$.

Transistors 320, 322, and 326 essentially form a current mirror. Transistor 322 converts a voltage at node N1 into a current that is provided through transistor 320. Transistors 320 and 326 are configured as a current mirror. The current through transistor 326 is proportional to the current through transistor 320 and depends on the ratio of the sizes of transistors 320 and 326. For example, if the size of transistor 326 is four times the size of transistor 320, the amount of current flowing through transistor 326 is approximately four times the amount flowing through transistor 320. Similar to transistor 310, transistor 328 is biased, through the reference voltage $V_{REF2}$, to provide a predetermined amount of current. Transistor 324 is configured as a diode to leak excess current at the input $S_{IN}$ of sense amplifier 120 and behaves like a resistive device.

Sense amp output buffer 350 "senses" the voltage at node N2 and provides an output signal in response to that voltage. Sense amp output buffer 350 can be design as a conventional inverting buffer using a pair of complementary transistors (e.g., a P-channel transistor and an N-channel transistor). Sense amp output buffer 350 performs the function of sense amp output buffer 222 shown in FIG. 2.

Transistor 340 provides a feedback path from the input of sense amp output buffer 350 (node N2) to the input $S_{IN}$ of sense amplifier 120. Transistor 340 is one implementation of feedback circuit 224 in FIG. 2 and is referred to as a feedback transistor. Other feedback circuits can be designed. Some examples include a switch and a transmission gate.

Sense amplifier 120 operates in the following manner. Memory cell 210 is typically designed to conduct a small and predetermined amount of current when it is in a conducting state. Whether memory cell 210 conducts or does not conduct is determine by the "voltage" or charge stored on the floating gate of transistor 212. Generally, if memory cell 210 is "programmed" to conduct (i.e., by storing a positive voltage on the floating gate of transistor 212) and it is selected by MUX 214, the voltage at $S_{IN}$ is pulled low. The low voltage at $S_{IN}$ slows down transistor 312 and causes the voltage at node N1 to increase. The higher voltage at node N1 turns on transistor 322 harder, causing transistor 322 to pull a "stronger" amount of current through transistor 320. Transistors 326 and 320 form a current mirror. Thus, if the size of transistor 326 is four times the size of transistor 320, for example, the amount of current flowing through transistor 326 is approximately four times that of transistor 320. The proportionally "stronger" amount of current through transistor 326 is greater than the predetermined amount of current through transistor 328 and causes the voltage at node N2 to transition high. Sense amp output buffer 350 provides a logic low in response to the high voltage at node N2.

Alternatively, a non-conducting memory cell 210 does not pull down the voltage at $S_{IN}$. However, transistor 308 pulls up the voltage at $S_{IN}$, causing transistor 312 to turn on harder and the voltage at node N1 to decrease. The lower voltage at node N1 slows down transistor 322 that then pulls a "weaker" amount of current through transistor 320. A proportionally "weaker" amount of current flows through transistor 326. The proportionally "weaker" amount of current through transistor 326 is less than the predetermined amount of current through transistor 328 and causes the voltage at node N2 to transition low. Sense amp output buffer 350 provides a logic high in response to the low voltage at node N2.

Sense amplifier 120 has a trip voltage $V_{TP}$ that is set by the circuit designer. The trip voltage $V_{TP}$ is the voltage at which the sense amplifier changes state. An input voltage below the trip voltage $V_{TP}$ results in a logic low at the sense amplifier output. Alternatively, an input voltage above the trip voltage $V_{TP}$ results in a logic high at the sense amplifier output.

Without feedback transistor 340, settling time of the voltage at the input $S_{IN}$ of sense amplifier 120 can be long. Consider the scenario wherein the voltage at $S_{IN}$ is initially low and a non-conducting transistor 212 is selected. Initially, the low voltage at $S_{IN}$ turns off transistor 312, causing transistor 322 to turn on hard, further causing transistor 320 to conduct large amount of current that quickly pulls the voltage at $S_{IN}$ higher. However, as the voltage at $S_{IN}$ increases past a diode drop of transistor 312, transistor 322 is turned on not quite as hard and the smaller amount of current through transistor 320 pulls the voltage at $S_{IN}$ higher but less quickly. This causes the voltage at $S_{IN}$ to round off while charging node $S_{IN}$ to the trip voltage $V_{TP}$ of sense amplifier 120. This phenomenon is shown by a solid line 410a in FIG. 4.

Consider another scenario wherein the voltage at $S_{IN}$ is initially higher than the trip voltage $V_{TP}$ of sense amplifier 120 and a conducting transistor 212 is selected. Since there is no transistor to pull the voltage at $S_{IN}$ lower, except for the ("weak") conducting transistor 212, the voltage at $S_{IN}$ requires a long time to settle near the trip voltage $V_{TP}$, as shown by a solid line 410b in FIG. 4.

With feedback transistor 340 enabled, the current through transistors 326 and 328 is used to quickly pull the voltage at $S_{IN}$ toward the trip voltage $V_{TP}$. For the example above wherein the voltage at $S_{IN}$ is initially low and a non-conducting transistor 212 is selected, the sourcing current at node N2 is provided by transistor 326, through feedback transistor 340, to quickly pull the voltage at $S_{IN}$ higher. This is shown by a dashed line 420a in FIG. 4.

Alternatively, when the voltage at $S_{IN}$ is initially high and a conducting transistor 212 is selected, the sinking current at node N2 is provided by transistor 328, through feedback transistor 340, to quickly pull the voltage at $S_{IN}$ lower. This is shown by a dashed line 420b in FIG. 4.

As an example of one design, the conducting memory cell 210 is designed to conduct 100 micro-ampere ($\mu$A). Transistors 320 and 326 are designed to provide 100$\mu$A and 400 $\mu$A, respectively, when fully turned on. Transistor 328 is designed to conduct a constant 150 $\mu$A. When the voltage at $S_{IN}$ is initially low and a non-conducting transistor 212 is selected, the current from transistor 326 (400 $\mu$A) is greater than the current (150 $\mu$A) through transistor 328. The net difference (250 $\mu$A) is used to charge parasitic capacitance at nodes N2 and $S_{IN}$ (through feedback transistor 340). Similarly, when the voltage at $S_{IN}$ is initially high and a conducting transistor 212 is selected, the current from transistor 326 (40 $\mu$A, for example) is less than the current (150 $\mu$A) through transistor 328. The net difference (110 $\mu$A) is used to discharge parasitic capacitance at nodes N2 and $S_{IN}$.

Figure 4:
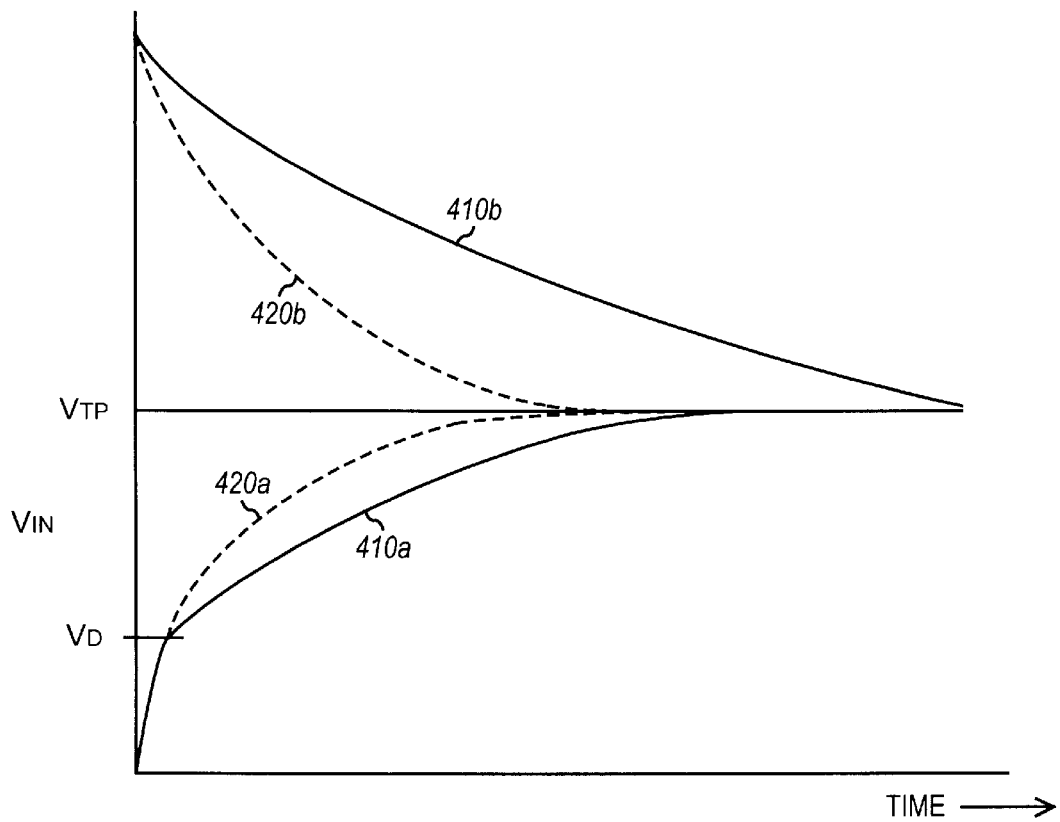
FIG. 4 is a graph illustrating the charge time at the input of the sense amplifier with and without a feedback transistor.

The improvement in setting time of the voltage at $S_{IN}$ is shown in FIG. 4 by the dashed lines 420a and 420b. Consider the same scenario as described above wherein the voltage at $S_{IN}$ is initially low and a non-conducting transistor 212 is selected. Initially, the low voltage at $S_{IN}$ turns off transistor 312, causing transistor 322 to turn on harder, further causing transistor 320 to conduct larger amount of current that quickly pulls the voltage at N2 higher. As the voltage at $S_{IN}$ increase, transistor 312 turns on harder and pulls the voltage at node N1 lower. Transistor 322 then turns on not quite as hard and a smaller amount of current flows through transistor 320, thus providing less charging current. However, transistor 326 is larger than transistor 320 and provides additional charging current through feedback transistor 340 to quickly charge the voltage at $S_{IN}$. The improvement in settling time with feedback transistor 340 is shown by the dashed line 420a. The setting time without feedback transistor 340 is shown by a solid line 410a.

In the conventional memory cell design, transistor 212 is designed to conduct a predetermined (and often small) amount of current when "programmed" to conduct. If the voltage at $S_{IN}$ is allowed to settle at a voltage far away from the trip voltage $V_{TP}$ of sense amplifier 120 (e.g., toward $V_{DD}$ by a non-conducting memory cell or toward $V_{SS}$ by a conducting memory cell), the next selected memory cell may require a long time to pull the voltage at $S_{IN}$ back toward the trip voltage. For example, if the voltage at $S_{IN}$ is initially high, a conducting transistor 212 would require a longer time to discharge the parasitic capacitor (that has been charged to the high voltage) at $S_{IN}$ toward the trip voltage because of the limited current sinking capability of the conducting transistor 212. Improved performance can be obtained by maintaining the voltage at $S_{IN}$ close to the trip voltage $V_{TP}$ of sense amplifier 120, by not allowing the voltage at $S_{IN}$ to "wander" too far from the trip voltage $V_{TP}$.

Sense amplifier 120 is designed such that the voltage at $S_{IN}$ settles at, or close to, the trip voltage $V_{TP}$. When a conducting memory cell 210 is selected, a voltage of approximately $V_{TP}$ at $S_{IN}$ biases transistors 312 and 322 such that transistor 320 provides enough source current for memory cell 210 and transistor 324. If the voltage at $S_{IN}$ moves lower (i.e., due to the conducting memory cell 210), the voltage at node N1 increases, thereby increasing the current through transistor 320 that then pulls the voltage at $S_{IN}$ higher toward a stable operating voltage. Thus, a feedback mechanism is provided by coupling of the source of transistor 322 to the gate of transistor 312. This feedback mechanism maintains the voltage at $S_{IN}$ to provide the current required by memory cell 210. Alternatively, when a non-conducting memory cell 210 is selected, the voltage at $S_{IN}$ settles only slightly higher (e.g., possible few tenths of a volt higher). The higher voltage at $S_{IN}$ results in a lower voltage at node N1 and correspondingly lower amount of current through transistor 320. This smaller amount of current is enough for transistor 324.

The voltage at node N2 has a wide range, depending on whether transistor 326 is turned on hard or turned on soft. Therefore, after the voltage at $S_{IN}$ has been pulled close to the trip voltage $V_{TP}$, feedback transistor 340 is disabled through the EQSA2 control signal. Generation of the EQSA2 control signal is described below.

The trip voltage $V_{TP}$ can be set at a desired voltage by selecting the proper size for the transistors, including transistors 310, 312, 320, 322, 326, and 328. In addition, the trip voltage $V_{TP}$ can be set at the desired voltage by adjusting the $V_{REF1}$ and $V_{REF2}$ reference voltages. The selection of various transistor sizes and reference voltages should take into consideration the conducting current of memory cell 210. In one embodiment, the trip voltage $V_{TP}$ is set at approximately 1.5V. However, other trip voltages can be used.

As shown in FIGS. 2 and 3, sense amplifier 120 can be designed similar to the topology of the sense amplifier in the '158 patent that is incorporated herein by reference. In one embodiment, sense amplifier 120 can be designed such that the state of the selected memory cell is compared against a known state of a "dummy" memory cell. In this case, sense amp output buffer 222 can include a comparator that receives two current signals, one signal indicative of the state of the selected memory cell and another signal indicative of the known state of the "dummy" memory cell. In another embodiment, either reference voltage $V_{REF1}$ or $V_{REF2}$, or both, can be set in accordance with a voltage generated by the known state of the "dummy" memory cell.

CONTROL CIRCUIT

Figure 5:
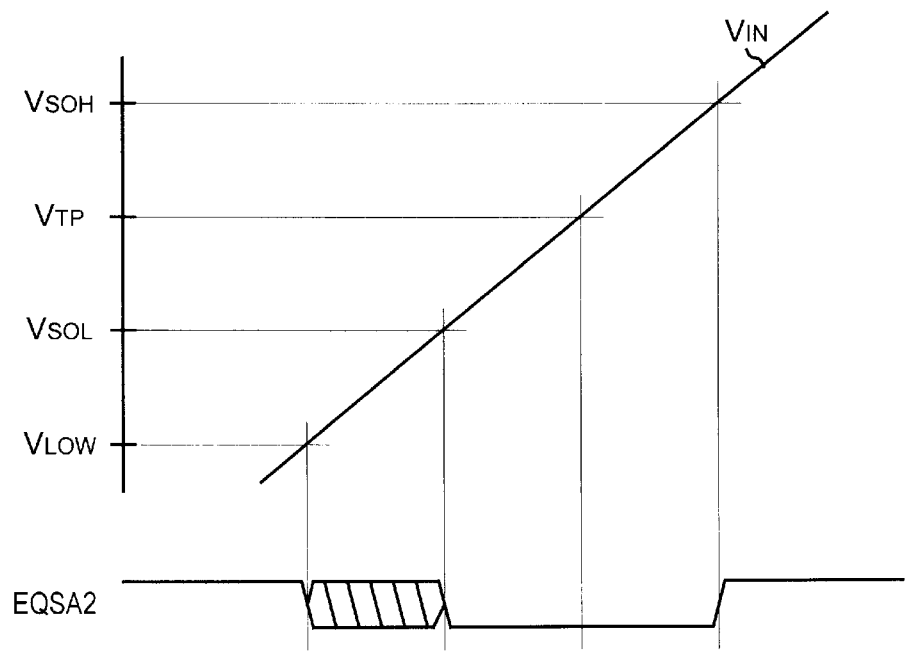
FIG. 5 is a graph illustrating the control signal to the feedback transistor versus input voltage.

To maintain the voltage at $S_{IN}$ close to the trip voltage $V_{TP}$, the feedback transistor is disabled when the voltage at $S_{IN}$ reaches close to the trip voltage $V_{TP}$. In one embodiment, a control circuit senses when the voltage at $S_{IN}$ is within a predetermined voltage range and disables the feedback transistor accordingly. The predetermined voltage range overlaps the trip voltage $V_{TP}$ and is defined by an upper threshold $V_{SOH}$ and a lower threshold $V_{SOL}$, as shown in FIG. 5. When the voltage at $S_{IN}$ is between $V_{SOL}$ and $V_{SOH}$, the feedback transistor is disabled by bringing the EQSA2 control signal to a logic low.

Figure 6:
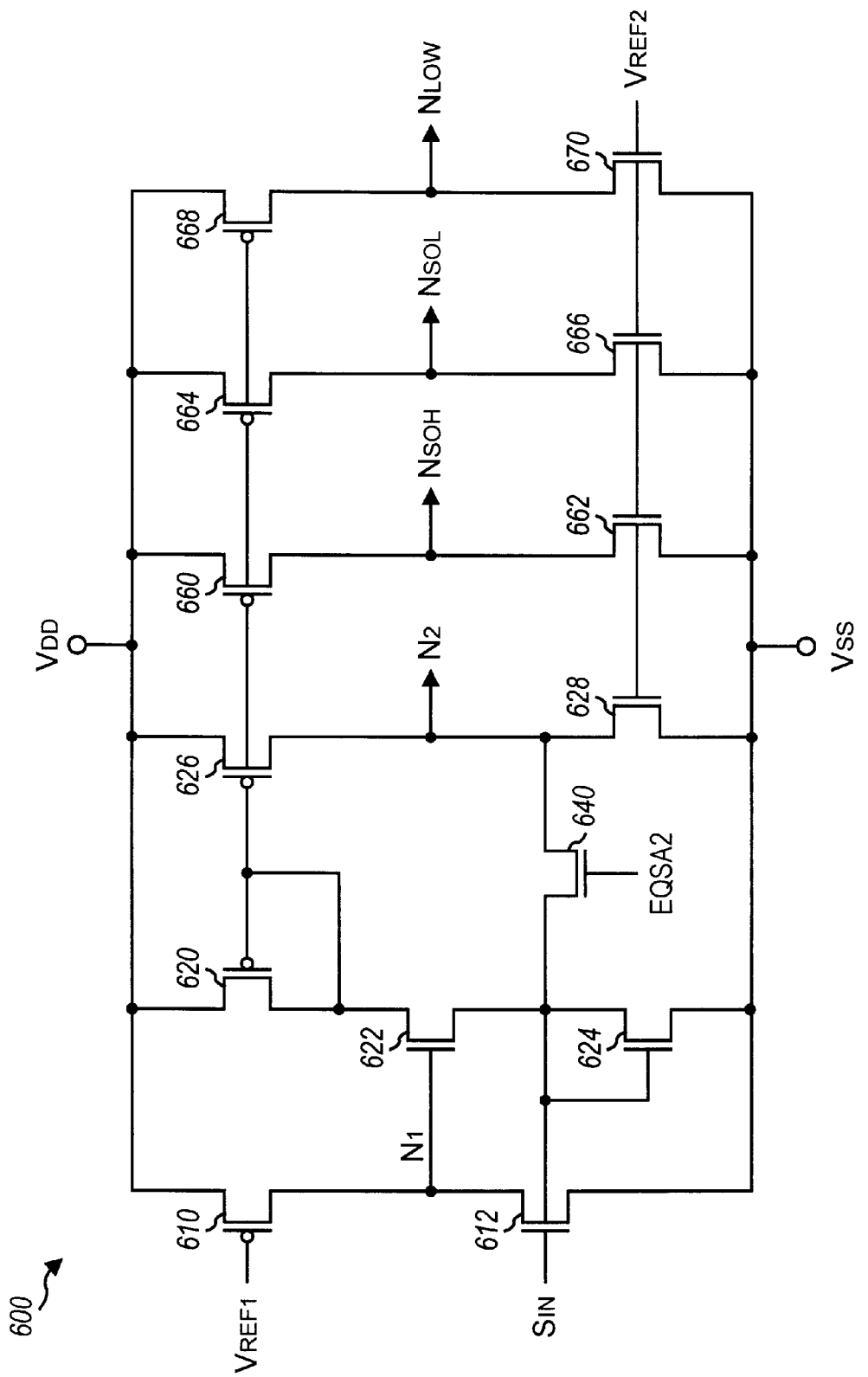
FIG. 6 is a simplified schematic of a sense amplifier having circuitry for sensing when the input voltage transitions within a predetermined voltage range.

FIG. 6 is a simplified schematic of a sense amplifier 620 having circuitry for "sensing" when the voltage at $S_{IN}$ exceeds the upper threshold $V_{SOH}$ or falls below the lower threshold $V_{SOL}$. Sense amplifier 620 includes similar voltage amplifier and current mirror as sense amplifier 120 shown in FIG. 3. In addition, sense amplifier 620 includes three additional current mirrors, each being similar to the current mirror composed of a P-channel transistor 626. The first additional current mirror includes a P-channel transistor 660 and is coupled in series with an N-channel transistor 662. The second additional current mirror includes a P-channel transistor 664 and is coupled in series with an N-channel transistor 666. And the third additional current mirror includes a P-channel transistor 668 and is coupled in series with an N-channel transistor 670.

In one embodiment, N-channel transistors 628, 662, 666, and 670 are sized similarly. To detect when the voltage at $S_{IN}$ exceeds $V_{SOH}$, the size of transistor 660 is made larger than that of transistor 626. This results in more current flowing through transistor 660. As the voltage at $S_{IN}$ exceeds $V_{SOH}$, the voltage at node N1 decreases, the current through transistors 620 and 622 decreases, and the current through transistor 660 also decreases. However, since the size of transistor 660 is larger than that of transistor 626, the voltage at node $N_{SOH}$ does not transition to logic low until the current through transistor 660 is reduced to less than the current through transistor 662, which occurs at a voltage higher than $V_{TP}$.

Similarly, to detect when the voltage at $S_{IN}$ falls below $V_{SOL}$, the size of transistor 664 is made smaller than that of transistor 626. This results in less current flowing through transistor 664. As the voltage at $S_{IN}$ falls below $V_{SOL}$, the voltage at N1 increases, the current through transistors 620 and 622 increases, and the current through transistor 664 also increases. However, since the size of transistor 664 is smaller than that of transistor 626, the voltage at the $N_{SOL}$ does not transition to logic high until the current through transistor 664 is increased to greater than the current through transistor 662, which occurs at a voltage lower than $V_{TP}$.

The third additional current mirror detects when the voltage at $S_{IN}$ falls below a low threshold $V_{LOW}$. The use of the third additional current mirror is described below. Typically, $V_{LOW}$ is set lower than $V_{SOL}$. Thus, the size of transistor 668 is made smaller than the size of transistor 664. This results in less current flowing through transistor 668 than transistor 664. As the voltage at $S_{IN}$ falls below $V_{LOW}$, the voltage at N1 increases, the current through transistors 620 and 622 increases, and the current through transistor 668 also increases. However, since the size of transistor 668 is smaller than that of transistors 626 and 664, the voltage at the $N_{LOW}$ does not transition to logic high until the current through transistor 668 is increased to greater than the current through transistor 662, which occurs at a voltage lower than $V_{SOL}$.

The upper threshold $V_{SOH}$, the lower threshold $V_{SOL}$, and the low threshold $V_{LOW}$ can be adjusted by selecting the proper transistor sizes for transistors 660, 664, and 668 respectively. To increase $V_{SOH}$, the size of transistor 660 is increased relative to the size of transistor 626. Similarly, to decrease $V_{SOL}$, the size of transistor 664 is decreased relative to the size of transistor 626. As an example of one design, transistors 626, 660, 664, and 668 are respectively four, five, three, and two times the size of transistor 620. Of course, it will be noted by those skilled in the art that these transistor sizes can be set to any dimension.

Node $N_{SOH}$ transitions to logic low when the voltage at $S_{IN}$ exceeds $V_{SOH}$ and node $N_{SOL}$ transitions to logic high when the voltage at $S_{IN}$ falls below $V_{SOL}$. When nodes $N_{SOH}$ and $N_{SOL}$ are at the same logic level (i.e., both are at either logic high or logic low), the voltage at $S_{IN}$ is between the upper and lower thresholds (within the predetermined voltage range).

Figure 7:
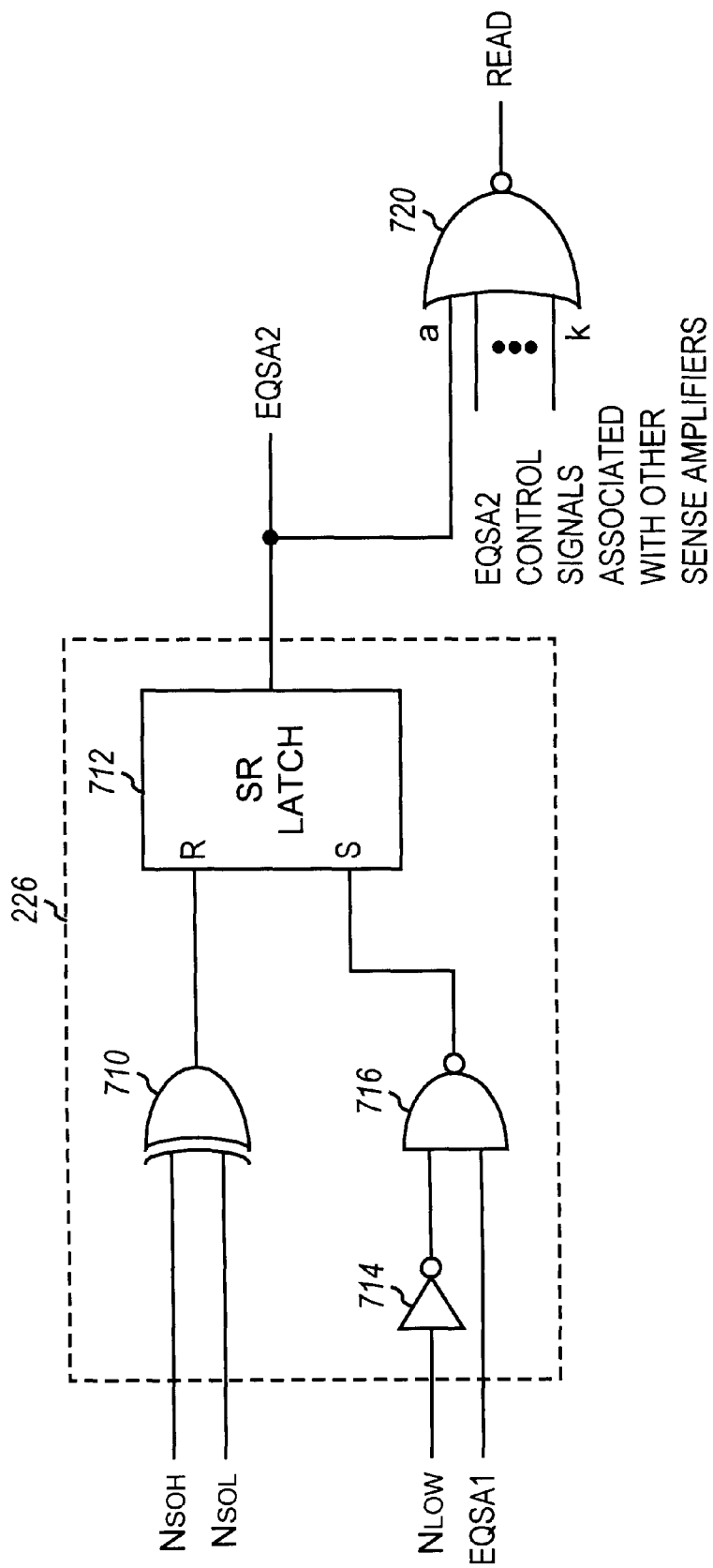
FIG. 7 is a circuit diagram illustrating one embodiment of a control circuit.

FIG. 7 illustrates one embodiment of a control circuit 226. The signals at nodes $N_{SOH}$ and $N_{SOL}$ are provided to two inputs of an exclusive-or (XOR) gate 710. The output of XOR gate 710 couples to a reset (R) input of a latch 712. The signal at node $N_{LOW}$ is provided to an input of inverter 714, the output of which is provided to an input of NAND gate 716. An EQSA1 signal is provided to the other input of NAND gate 716. The output of NAND gate 716 couples to a set (S) input of latch 712. The output of latch 712 forms the EQSA2 control signal that is provided to the gate of the feedback transistor.

XOR gate 710 may not be necessary in some embodiments. For example, in an embodiment wherein the voltage at $S_{IN}$ is preset to a high voltage before a read of a memory cell, only one additional sensing circuit ($N_{SOH}$) is required and XOR gate 710 can be replace with an inverter. Similarly, in an embodiment wherein the voltage at $S_{IN}$ is reset to a low voltage, only one sensing circuit ($N_{SOL}$) is required and XOR gate 710 can also be replace with an inverter.

Control circuit 226 operates in the following manner. When the signals at nodes $N_{SOH}$ and $N_{SOL}$ are at different logic levels, indicating that the voltage at $S_{IN}$ is within predetermined voltage range, the output of XOR gate 710 is logic high. This logic high resets the output of latch 712 to logic low. The logic low on the EQSA2 control signal disables the feedback transistor.

Figure 8A:
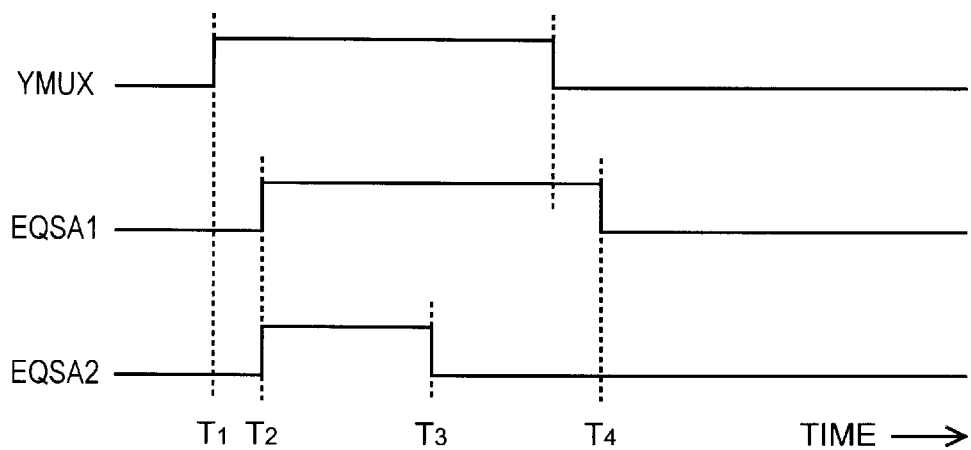
FIGS. 8A–8A are graphs illustrating the timing relationship between the various enable and control signals.

FIG. 8A illustrates the timing relationship between the various enable and control signals. Typically, before the read cycle at T1, the YMUX signal is enabled and the MUX couples the selected memory cell to the sense amplifier (see FIG. 3). At time T2, the EQSA1 signal is enabled (brought to logic high). The EQSA2 control signal is also enabled to allow the feedback transistor to assist in charging or discharging the voltage at $S_{IN}$. As soon as the voltage at $S_{IN}$ transitions within the predetermined voltage range, at T3, the EQSA2 control signal is brought to logic low to disable the feedback transistor. At T4, the output of the sense amplifier is "read".

In some situation, if the timing of the EQSA1 signal is not matched with the decoder (i.e., MUX 214 in FIG. 3) delay the sense amplifier may not realize this and may have already turned off the feedback transistor (by bringing the EQSA2 control signal low). When the YMUX signal is finally enabled, the low voltage at Bit Line (see FIG. 3) will pull the voltage at $S_{IN}$ low, due to the charge sharing of the bit line capacitance (3 pF, for example) with the smaller parasitic capacitance (0.4 pF, for example) at $S_{IN}$. The sense amplifier is disabled and cannot be used to assist in charging the low voltage at $S_{IN}$.

To avoid this problem, an additional sensing circuit senses when the voltage at $S_{IN}$ falls below the low threshold $V_{LOW}$. Typically, $V_{LOW}$ is set lower than $V_{SOL}$. As an example, $V_{LOW}$ can be set at half the trip voltage $V_{TP}$. When the voltage at $S_{IN}$ falls below $V_{LOW}$, the signal at node $V_{LOW}$ transitions to logic high. Referring to FIG. 7, the logic high at node $V_{LOW}$ results in a logic low at the output of inverter 712. This logic low results in a logic high at the output of NAND gate 716 that sets the output of latch 712 to a logic high. The logic high on the EQSA2 control signal again enables the feedback transistor. The $V_{LOW}$ sensing circuit is used when the Bit Line is disabled to ground (or a voltage below the trip voltage of the sense amplifier). For circuits wherein the Bit Line is preset to a high voltage (or a voltage above the trip voltage of the sense amplifier) a $V_{HIGH}$ sensing circuit can used, where $V_{HIGH}$ is a higher voltage than $V_{SOH}$.

Figure 8B:
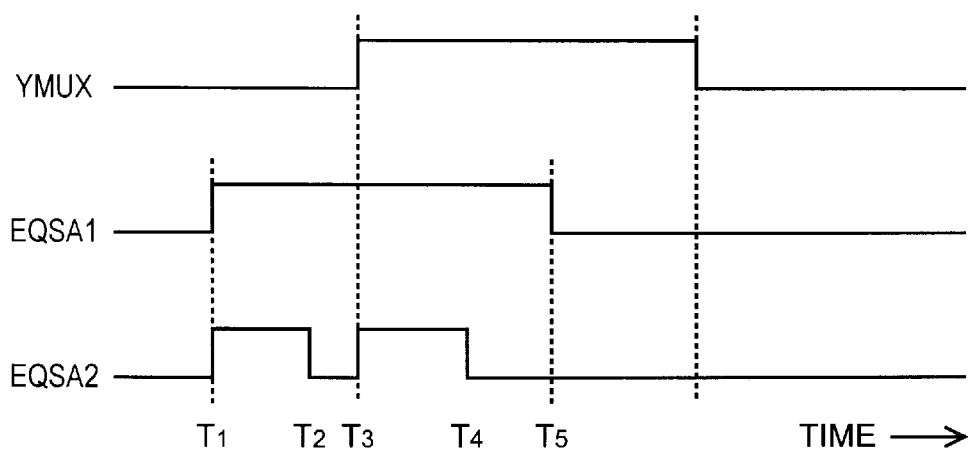

Referring back to FIG. 8B, at T1, the EQSA1 and EQSA2 signals are enabled. At T2, the sense circuit determines that the voltage at $S_{IN}$ is within the predetermined voltage range, thus indicating that the voltage at $S_{IN}$ has settled. Therefore, control circuit 226 brings the EQSA2 control signal low and disables the feedback transistor. However, at T3, the YMUX signal is finally enabled and the MUX couples the selected memory cell to the sense amplifier. The additional sensing circuit detects that the YMUX signal is just enabled, because the voltage at $S_{IN}$ falls below $V_{LOW}$, and re-enables the feedback transistor. At T4, the voltage at $S_{IN}$ settles again. At T5, the output of the sense amplifier is "read".

When the read cycle is over, the EQSA1 signal transitions to logic low. Referring to FIG. 7, this logic low results in a logic high at the output of NAND gate 716, thereby setting the output of latch 712 and consequently enabling the EQSA2 control signal. Thus, when the EQSA1 signal is brought low at the end of the read cycle, the feedback transistor is enabled and ready for the start of the next read cycle.

The EQSA2 control signal can be used to expedite the read cycle. In the conventional memory device design, the EQSA1 signal is enabled for a period of time dictated by the longest read cycle. Even if the sense amplifiers for all selected memory cells have settled to a final value, the conventional memory device has no knowledge of this fact. Thus, there is no intelligence to perform a read of the sense amplifier before the EQSA1 signal is brought to logic low.

FIG. 7 illustrates one embodiment of a logic circuit used to detect when the sense amplifiers are ready to be "read". The EQSA2 control signals from all sense amplifiers are provided to the inputs of a NOR gate 720. The output of NOR gate 720 forms the READ signal. When all sense amplifiers are settled, the EQSA2 control signals are logic low and the output of NOR gate 720 is logic high. The sense amplifiers can be "read" at the low to high transition of the READ signal.

The previous description of the specific embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A sense amplifier comprising:
    an input amplifier configured to receive and amplify a signal from a memory cell;
    a first current mirror coupled to the input amplifier and configured to receive the amplified signal and generate at least one current signal, wherein each of the at least one current signal is related to the amplified signal by a respective gain factor; and
    a feedback circuit operatively coupled to the input amplifier and the first current mirror, the feedback circuit configured to provide a feedback between an output of the first current mirror and an input of the input amplifier, and
    wherein the feedback circuit is selectively enabled for a particular duration of time during a sensing operation.

2. The sense amplifier of claim 1, further comprising:
a reference current source coupled to the first current mirror and configured to provide a reference current.

3. The sense amplifier of claim 2, wherein the reference current source is configured to receive a signal from a dummy memory cell.

4. The sense amplifier of claim 1, wherein the feedback circuit is disabled when voltage at the input of the input amplifier falls within a particular voltage range.

5. The sense amplifier of claim 1, wherein a bias current of the first current mirror is set, in part, based on a conducting memory cell current.

6. The sense amplifier of claim 1, wherein a bias current of the first current mirror is set, in part, based on a trip voltage of the input amplifier.

7. The sense amplifier of claim 6, wherein the trip voltage of the sense amplifier is set at approximately 1.5 volts.

8. The sense amplifier of claim 1, wherein the feedback circuit is implemented with a MOS transistor.

9. The sense amplifier of claim 1, further comprising:
a buffer coupled to the output of the first current mirror.

10. The sense amplifier of claim 1, wherein the first current mirror is configured to provide a first current signal and a second current signal, wherein the first current signal is provided to the input amplifier and the second current signal is provided to a reference current source.

11. The sense amplifier of claim 1, further comprising:
a control circuit coupled to the feedback circuit and configured to generate a control signal for the feedback circuit, wherein the control signal disables the feedback circuit when voltage at the input of the input amplifier falls within a particular voltage range.

12. The sense amplifier of claim 1, wherein the input amplifier, the first current mirror, and the feedback circuit are implemented with MOS transistors.

13. An integrated circuit having an embedded memory that includes at least one sense amplifier of claim 1.

14. A memory circuit comprising at least one sense amplifier of claim 1.

15. A dynamic random access memory circuit comprising at least one sense amplifier of claim 1.

16. A sense amplifier comprising:
an input amplifier operative to receive and amplify a signal from a memory cell;
a first current mirror coupled to the input amplifier and configured to receive the amplified signal and generate at least one current signal;
a feedback circuit operatively coupled to an output of the first current mirror and an input of the input amplifier, wherein the feedback circuit is selectively enabled for a particular duration of time during a sensing operation;
a second current mirror coupled to the input amplifier and configured to sense whether voltage at the input of the input amplifier exceeds an upper threshold; and
a third current mirror coupled to the input amplifier and configured to sense whether the voltage at the input of the input amplifier falls below a lower threshold.

17. The sense amplifier of claim 16, further comprising:
a fourth current mirror coupled to the input amplifier and configured to sense whether the voltage at the input of the input amplifier exceeds a low threshold; and
wherein the feedback circuit is enabled when the voltage at the input of the input amplifier falls below the low threshold.

18. The sense amplifier of claim 16, wherein the feedback circuit is disabled when the voltage at the input of the input amplifier falls within a voltage range defined by the upper and lower thresholds.

19. The sense amplifier of claim 16, further comprising:
a buffer coupled to the first current mirror.

20. The sense amplifier of claim 16, wherein the feedback circuit is implemented with one or more MOS transistors.

21. The sense amplifier of claim 16, wherein the input amplifier, the first current mirror, and the feedback circuit are implemented with MOS transistors.

22. A sense amplifier for detecting a logic state of a memory cell comprising:
an input amplifier operative to receive and amplify a signal from the memory cell;
a first current mirror coupled to the input amplifier and configured to receive the amplified signal and generate at least one current signal, wherein each of the at least one current signal is related to the amplified signal by a respective gain factor and provided via a respective current path;
a reference current source coupled to a first current path of the first current mirror; and
a feedback circuit coupled to an input of the input amplifier and an output of the first current mirror, wherein the feedback circuit is selectively enabled for a particular duration of time during a sensing operation.

23. A memory device comprising:
a plurality of memory cells;
a plurality of sense amplifiers, each sense amplifier operatively and selectively coupled to a respective set of memory cells, wherein each sense amplifier includes a feedback circuit that couples between an output and an input of the sense amplifier;
at least one control circuit, each control circuit coupled to at least one associated sense amplifier and configured to generate a respective control signal for the feedback circuit within the at least one associated sense amplifier; and
a logic circuit coupled to the plurality of control circuits, the logic circuit configured to generate a read signal when voltages at the inputs of the plurality of sense amplifiers are each within a particular voltage range.

24. A method for sensing a logic state of a memory cell comprising:
receiving an input signal indicative of the logic state of the memory cell;
determining whether the input signal is within a particular range;
if the input signal is determined to be outside the particular range, pulling the input signal toward a trip voltage with a feedback signal; and
detecting the logic state of the memory cell based on the input signal, and
wherein the feedback signal is selectively enabled for a particular duration of time during a sensing operation.

25. The method of claim 24, wherein the feedback signal is generated based, in part, on a voltage of the input signal.

26. The method of claim 24, wherein the feedback signal is generated based, in part, on a conducting memory cell current.

27. The method of claim 24, wherein the feedback signal is generated based, in part, on a previously sensed logic state.

28. A method for sensing a logic state of a memory cell comprising:
receiving an input signal indicative of the logic state of the memory cell;

determining whether the input signal is within a particular range;

if the input signal is determined to be outside the particular range, pulling the input signal toward a trip voltage with a feedback signal, wherein the feedback signal is generated based, in part, on a conducting memory cell current and a voltage of the input signal;

amplifying the input signal with a particular gain;

detecting the amplified signal;

generating a sensed signal based on the detected signal, wherein the sensed signal is indicative of the sensed logic state of the memory cell; and buffering the sensed signal to generate an output signal, and wherein the feedback signal is selectively enabled for a particular duration of time during a sensing operation.

29. A sense amplifier comprising:

an input amplifier configured to receive and amplify an input signal;

a comparison circuit coupled to the input amplifier and configured to receive and compare the amplified signal with a reference signal;

a feedback circuit coupled to an output of the comparison circuit and an input of the input amplifier, wherein the feedback circuit is selectively enabled for a particular duration of time during a sensing operation;

a first sensing circuit coupled to the input amplifier and configured to sense whether voltage at the input of the input amplifier exceeds an upper threshold; and a second sensing circuit coupled to the input amplifier and configured to sense whether the voltage at the input of the input amplifier falls below a lower threshold.

30. The sense amplifier of claim 29, further comprising:

a third sensing circuit coupled to the input amplifier and configured to sense whether the voltage at the iniput of the input amplifier exceeds a low threshold, and wherein the feedback circuit is enabled when the voltage at the input of the input amplifier falls below the low threshold.

31. The sense amplifier of claim 29, wherein the comparison circuit is implemented with a current mirror.

32. The sense amplifier of claim 29, wherein the first and second sensing circuits are each implemented with a current mirror.

33. The sense amplifier of claim 29, further comprising:

a control circuit coupled to the feedback circuit and configured to generate a control signal for the feedback circuit, wherein the control signal disables the feedback circuit when the voltage at the input of the input amplifier falls within a particular voltage range.

* * * * *